(12) United States Patent
Kaku et al.

(10) Patent No.: US 6,882,684 B2
(45) Date of Patent: Apr. 19, 2005

(54) AUTOMATIC GAIN CONTROL CIRCUIT, DATA COMMUNICATION DEVICE AND AUTOMATIC GAIN CONTROL METHOD

(75) Inventors: Takashi Kaku, Tama (JP); Hideo Miyazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 683 days.

(21) Appl. No.: 09/756,793

(22) Filed: Jan. 10, 2001

(65) Prior Publication Data

US 2001/0016019 A1 Aug. 23, 2001

(30) Foreign Application Priority Data

Jan. 11, 2000 (JP) ........................ 2000-002134

(51) Int. Cl.[7] .................... H03H 7/30; H03H 7/40; H03K 5/159
(52) U.S. Cl. ............... 375/229; 348/528; 379/388.03; 342/92; 359/341.41
(58) Field of Search ................ 375/229, 348, 375/345; 455/192

(56) References Cited

U.S. PATENT DOCUMENTS

| | | | | |
|---|---|---|---|---|
| 4,689,805 A | * | 8/1987 | Pyhalammi et al. | 375/229 |
| 4,989,074 A | * | 1/1991 | Matsumoto | 348/572 |
| 5,040,194 A | * | 8/1991 | Tjahjadi et al. | 375/345 |
| 5,228,063 A | * | 7/1993 | Zucker | 375/345 |
| 5,448,595 A | * | 9/1995 | Kaku et al. | 375/345 |
| 6,154,503 A | * | 11/2000 | Strolle | 375/264 |
| 6,324,228 B1 | * | 11/2001 | Millward et al. | 375/344 |
| 6,459,458 B1 | * | 10/2002 | Balaban | 348/678 |
| 6,516,183 B1 | * | 2/2003 | Hellmark | 455/78 |
| 2002/0034221 A1 | * | 3/2002 | Webster | 375/229 |

* cited by examiner

Primary Examiner—Stephen Chin
Assistant Examiner—Harry Vartanian
(74) Attorney, Agent, or Firm—Staas & Halsey LLP

(57) ABSTRACT

An automatic gain control circuit includes a first portion which calculates a first error amount, and a second portion which calculates a second error amount. Both calculated error amount is sent to a determination module. Further, an integrator integrates an error amount, a difference between a power of an input signal and an average power of an eye pattern for example. The determination determines whether the integrated error amount exceeds a predetermined value or not, and output either of the first error amount and the second error amount based on the determination.

10 Claims, 9 Drawing Sheets

| AREA | DETERMINATION POINT | RECTIFYING SIGNAL | DETERMINATION POINT × RECTIFYING SIGNAL |
|---|---|---|---|
| 0 | −3.0 , 3.0 | −0.333 , −0.333 | 2.0 , 0.0 |
| 1 | −1.0 , 3.0 | −0.2 , −0.6 | 2.0 , 0.0 |
| 2 | 1.0 , 3.0 | 0.2 , −0.6 | 2.0 , 0.0 |
| 3 | 3.0 , 3.0 | 0.333 , −0.333 | 2.0 , 0.0 |
| 4 | −3.0 , 1.0 | −0.6 , −0.2 | 2.0 , 0.0 |
| 5 | −1.0 , 1.0 | −1.0 , −1.0 | 2.0 , 0.0 |
| 6 | 1.0 , 1.0 | 1.0 , −1.0 | 2.0 , 0.0 |
| 7 | 3.0 , 1.0 | 0.6 , −0.2 | 2.0 , 0.0 |
| 8 | −3.0 , −1.0 | −0.6 , 0.2 | 2.0 , 0.0 |
| 9 | −1.0 , −1.0 | −1.0 , 1.0 | 2.0 , 0.0 |
| A | 1.0 , −1.0 | 1.0 , 1.0 | 2.0 , 0.0 |
| B | 3.0 , −1.0 | 0.6 , 0.2 | 2.0 , 0.0 |
| C | −3.0 , −3.0 | −0.333 , 0.333 | 2.0 , 0.0 |
| D | −1.0 , −3.0 | −0.2 , 0.6 | 2.0 , 0.0 |
| E | 1.0 , −3.0 | 0.2 , 0.6 | 2.0 , 0.0 |
| F | 3.0 , −3.0 | 0.333 , 0.333 | 2.0 , 0.0 |

FIG.8

AUTOMATIC GAIN CONTROL CIRCUIT, DATA COMMUNICATION DEVICE AND AUTOMATIC GAIN CONTROL METHOD

CROSS REFERENCE TO RELATED APPLICATIONS

The contents of 2000-002134, filed Jan. 11, 2000 in Japan to which this application claims priority, are incorporated herein by reference.

BACKGROUNG OF THE INVENTION

1. Field of the Invention

The present invention relates to data communication devices, in particular, to data communication devices comprising automatic gain control circuits that maintain a uniform average level of equalizer output.

The present invention also relates to automatic gain control circuits such as those used in data communication devices or other such devices.

The present invention further relates to automatic gain control method.

2. Description of the Related Art

Traditionally, AGC (Automatic Gain Control) circuits are used in data communication devices to keep the average level of an input signal uniform.

FIG. 5 shows an example of a conventional AGC circuit 40. In FIG. 5, double lines show vector signal, and single lines shows scalar signal. An equalizer (not shown in FIG. 5) is connected to one side of the AGC circuit 40, and vector signal output from the equalizer enters the AGC circuit 40. The signal firstly enters a squaring circuit 44. The squaring circuit 44 calculates a power of the input signal by squaring the input signal.

The squared signal is then sent to a subtracting circuit 46, and is subtracted from a predetermined reference signal "Ref". An amount of the reference signal equals to an amount of an average power of an eye pattern. Therefore, the subtracting circuit 46 calculates a difference between the average power and a power of the input signal. This difference will be called an error hereafter.

An output of the subtracting circuit 46, an error signal, then enters a first multiplier 48, and is multiplied by a coefficient alpha, which controls an integration time of an integration circuit 50. An output of a first multiplier 48 is then sent to the integration circuit 50, and errors are accumulated. An accumulated amount is sent to a second multiplier 42 to be multiplied with the input signal from the equalizer.

By this manner, a level of an output signal AGC out from the AGC circuit is stabilized.

FIG. 6 shows another example of an AGC circuit 60. As in FIG. 5, double lines show vector signal and single lines show scalar signal.

The AGC circuit 60 shown in FIG. 6 has a first multiplier 64. An input signal from an equalizer enters the first multiplier 64. The first multiplier 64 multiplies the input signal by a rectifying signal.

FIG. 7 shows an example of a detection surface used in a conventional modem. FIG. 7 shows an example that there are 16 determination points (area) arranged on the detection surface. Each determination point, shown in black circle in FIG. 7, is arranged in a middle of corresponding area. For example, a determination point for area "0" is arranged on a coordinate of [−3.0, 3.0], a determination point for area "1" is arranged on a coordinate [−1.0, 3.0], and so on.

FIG. 8 shows a table describing relationship between each area of the detection surface shown in FIG. 7 and determination point, rectifying signal and a product of determination point and rectifying signal. A rectifying signal for each area is selected such that a product of a determination point and a rectifying signal becomes constant, [2.0, 0.0] for example. Therefore, a rectifying signal for area "0", in which a coordinate of a determination point is [−3.0, 3.0], is [−0.333, −0.333].

The first multiplier 64 of FIG. 6 outputs a real portion of a product of the rectifying signal and an input signal. When the input signal is exactly on a determination point, which is an ideal point, the output from the multiplier will be "2.0". In fact, a level of an input signal may not stabilized when the input signal enters the AGC circuit 60, and an output signal from the first multiplier 64 may not be "2.0".

The output signal from the first multiplier 64 is sent to a subtracting circuit 66, and is subtracted from a reference signal (Ref). The reference signal has a same amount as a real part of a product of the determination point and the rectifying signal, which is "2.0" for this case. Therefore, an output from the subtracting circuit 66 indicates a difference between an ideal product and an actual product calculated by the first multiplier 64. This difference shows how far the input signal is from the ideal determination point. The amount of a difference, will be called an error hereafter, depends on a level of an input signal, and the AGC circuit 60 shown in FIG. 6 uses an error to control level of an input signal.

An error signal, which is an output of the subtracting circuit 66, is sent to a second multiplier 68 to be multiplied by a coefficient alpha, and then sent to an integrator 70, as same as the AGC circuit 40 shown in FIG. 5. An output signal from the integrator 70 is sent to a third multiplier 62, and is multiplied with an input signal from an equalizer.

However, conventional AGC circuits had the following sorts of problems.

The first type of AGC circuit shown in FIG. 5 integrates an error amount between a power of an input signal and an average power of an eye pattern. Therefore, it is suitable for control a level of an input signal roughly. However, whenever a signal that is extremely larger or smaller than the average power is input into the AGC circuit, the large error is integrated by an integrator. Therefore, a result of the integration may be affected in response to the input signal, and a level of output signal from the AGC circuit cannot be stabilized.

In order to avoid an effect of such a large and sudden change, an integration time of the integrator may be increased by reducing a value of parameter alpha, which determines an integration time in the AGC circuit of FIG. 5. However, when the parameter alpha is made smaller and the integration time is increased, it requires a large amount of time before an output of the AGC circuit converges.

On the other hand, the second type of AGC circuit shown in FIG. 6 integrates an error between a real component of a product of the rectifying signal and the input signal and a real component of the rectifying signal and the ideal determination point. This type of AGC circuit also has a problem.

FIG. 9 shows an example of an eye pattern in which a level of a received signal is smaller than it is expected. In FIG. 9, white circles show ideal determination points, and black circles show actual eye pattern of received signals. In this case, an eye pattern of the received signals is the half size of what is expected, and all of the received signal points are within inmost four areas of the determination surface, 5, 6, 9 and A. If a power of received signal is small, it has to be expanded to fit an ideal size. Unfortunately, a modem may determine that those half-sized received signal points are all corresponding to inmost areas. Therefore, an eye pattern of the input signal may be fixed as shown in black circles, and it is difficult to put back an eye pattern of the received signals into a proper size.

SUMMARY OF THE INVENTION

This invention solves the above-mentioned problems of the related art.

An object of the present invention is to provide automatic gain control circuits to solve the above-mentioned problems.

Another object of the present invention is to provide automatic gain control method to solve the above-mentioned problems.

Another object of the present invention is to provide communication device to solve the above-mentioned problems.

To solve the aforementioned problems, the automatic gain control circuit of the present invention comprises a first error calculation circuit which calculates an amount of first error between an input signal and a first reference, and outputs a first signal corresponding to the first error. The automatic gain control circuit of the present invention further comprises a second error calculation circuit which calculates an amount of second error between an input signal and a second reference and outputs a second signal corresponding to the second error. A determination circuit is connected to the first error calculation circuit and the second error calculation circuit, and determines a value of an output signal from the first error calculation circuit, and selects one of the first and second signals based on the determination. An output signal from the determination circuit is integrated by an integrator.

More particularly, in one aspect of the automatic gain control circuit of the present invention comprises a first multiplier and a second multiplier connected to an output port of the first error calculation circuit and the second error calculation circuit respectively. Further, the determination circuit outputs a signal of an amount of 1 to one of the first or second multiplier, and a signal of an amount of 0 to the other one of the first or second multiplier, based on the determination.

Further, in the other aspect of the automatic gain control circuit of the present invention comprises a first AND circuit and a second AND circuit connected to an output port of the first error calculation circuit and the second error calculation circuit respectively. Then the determination circuit outputs a signal of an amount of 1 to one of the first or second AND circuit, and a signal of an amount of 0 to the other one of the first or second AND circuit, based on the determination.

In addition, a data communications device of the present invention comprises an equalizer for equalizing an input signal from a communication line and an automatic gain controller, connected to the equalizer, to control a level of an input signal to be stabilized in a constant value. Further, the automatic gain controller comprises a first error calculation circuit for calculating a first error value between an input signal and a first reference signal and a second error calculation circuit for calculating a second error value between an input signal and a second reference signal. An integrating circuit is connected to the first or second error calculation circuits, and integrates a difference between a level of an input signal and a predetermined value. A determination module is connected to the first error calculation circuit, the second error calculation circuit and the integrating circuit, and determines whether an output signal of the integrating circuit is larger than the predetermined value. The determination module selects one of the first error calculation circuit and the second error calculation circuit for an automatic gain control based on the determination.

More particularly, in one aspect of the data communications device of the present invention, the first error calculation circuit comprises a squaring circuit for squaring an input signal and a comparator for comparing a difference between the squared signal and a reference signal.

In the other aspect of the data communication device of the present invention, the second error calculation circuit comprises a rectifying circuit for rectifying an input signal and a comparator for comparing a difference between the rectified signal and a reference signal.

Moreover, an automatic gain control circuit of the present invention comprises a first error calculation circuit and a second error calculation circuit. The first error calculation circuit calculates a first error amount between a power of an input signal and an average power of an eye pattern. The second error calculation circuit calculates a second error amount between a product of an input signal and a rectifying signal and a product of an ideal signal and a rectifying signal. Further, the automatic gain control circuit comprises a first integrator for integrating the first error amount. A determination module is connected to the first error calculation circuit, the second calculation circuit and the first integrator. The determination module determines whether the integrated error amount exceeds an average power of an eye pattern or not. When it is determined that the integrated first error amount exceeds the average power of an eye pattern, and output the second error amount when it is determined that the integrated error amount does not exceed the average power of an eye pattern. An integrator integrates the output signal from the determination module.

Moreover, an automatic gain control method of the present invention calculates a first error between an input signal and a first reference and a second error between an input signal and a second reference. Then a value of the first error is determined, and one of the first error or the second error is selected as an output based in the determination. The selected error is integrated.

Further, an automatic gain control method of the present invention calculates a first error between a power of an input signal and an average power of an eye pattern. Similarly, a second error between a product of an input signal and a rectifying signal and a product of an ideal signal and a rectifying signal is calculated. Further, the first error is integrated. Then, it is determined if the integrated first error exceeds the average power of an eye pattern. If the integrated first error exceeds the average power, then the first error is selected as an output. On the other hand, the second error is selected as an output when the integrated first error does not exceeds the average power. The selected error is then integrated.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 8 is a diagram showing the relationship between determination point s and rectifying signal.

DESCRIPTION OF THE PREFERRED EMBODIMENT

Figure 1:
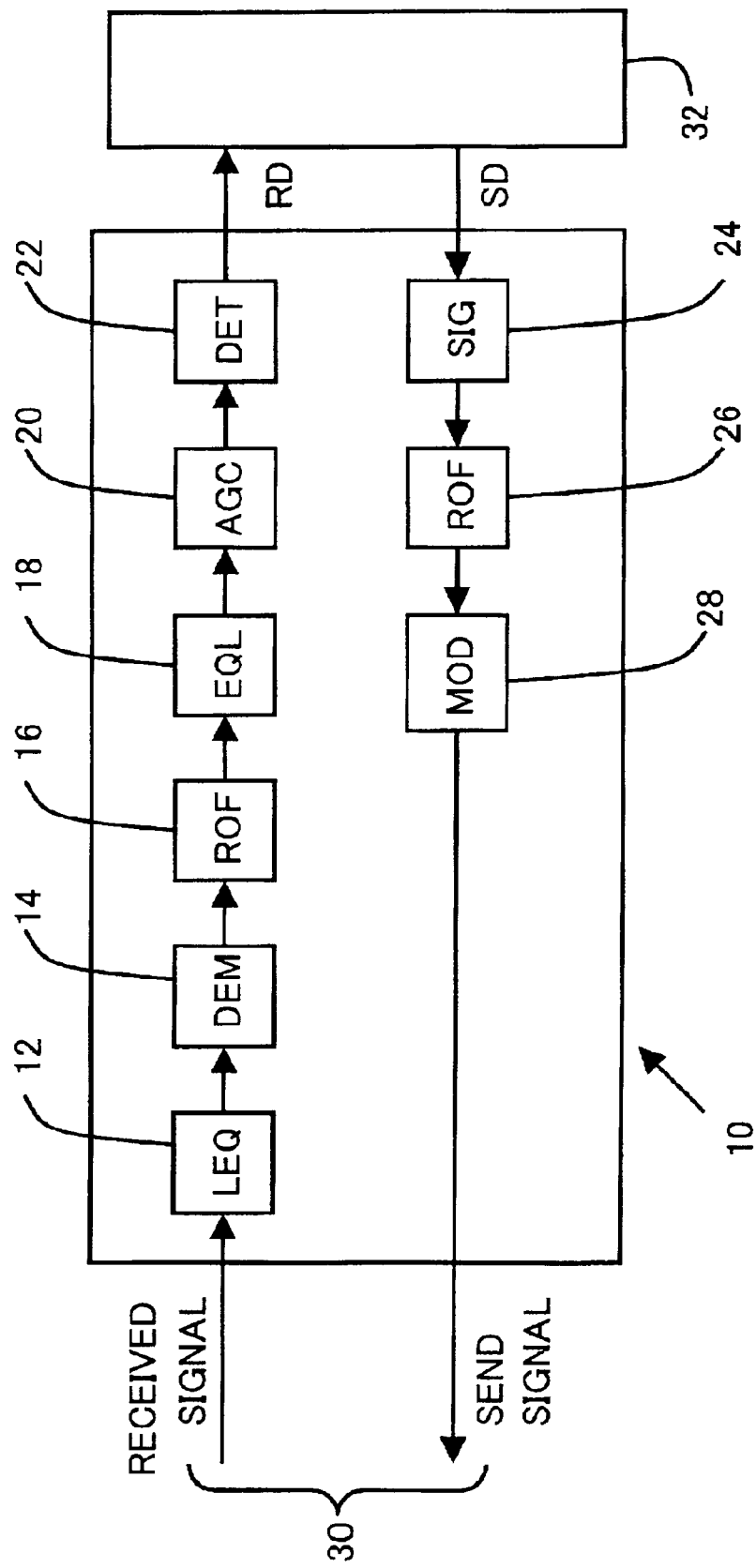
FIG. 1 is an example of a device using an embodiment of the present invention.

FIG. 1 is a diagram showing a communication device 10 of an embodiment of this present invention. FIG. 1 shows a configuration of a modem as an example of the communication device. This invention is not restricted to communication devices, but may apply to any device requires automatic gain control.

In FIG. 1, a data terminal 32, a personal computer for example, is connected to one side of the modem 10. On the other hand, communication lines 30 are connected to the other side of the modem 10.

Figure 7:
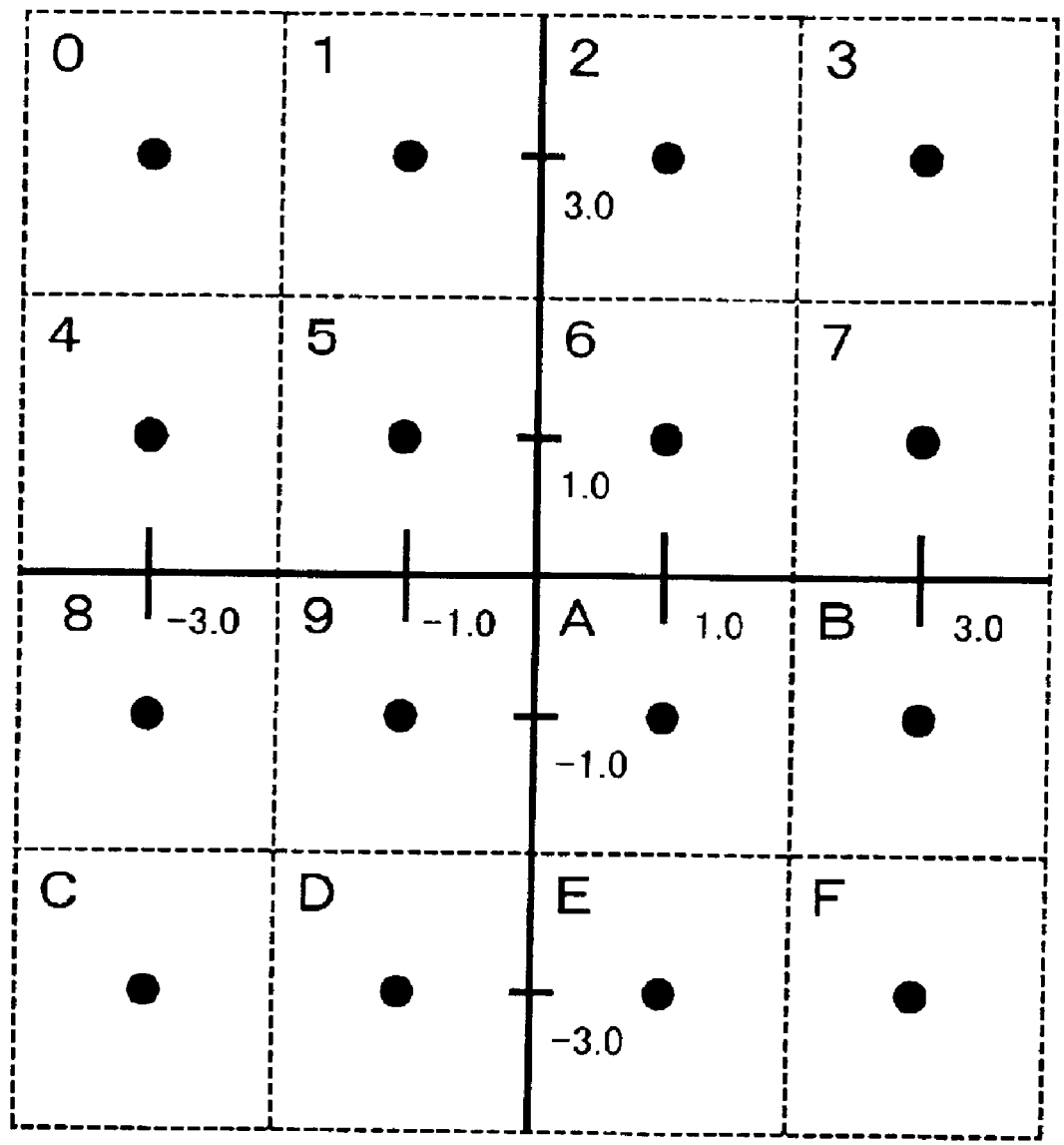
FIG. 7 is a diagram showing an example of an eye pattern and the judgment surface.
Figure 9:
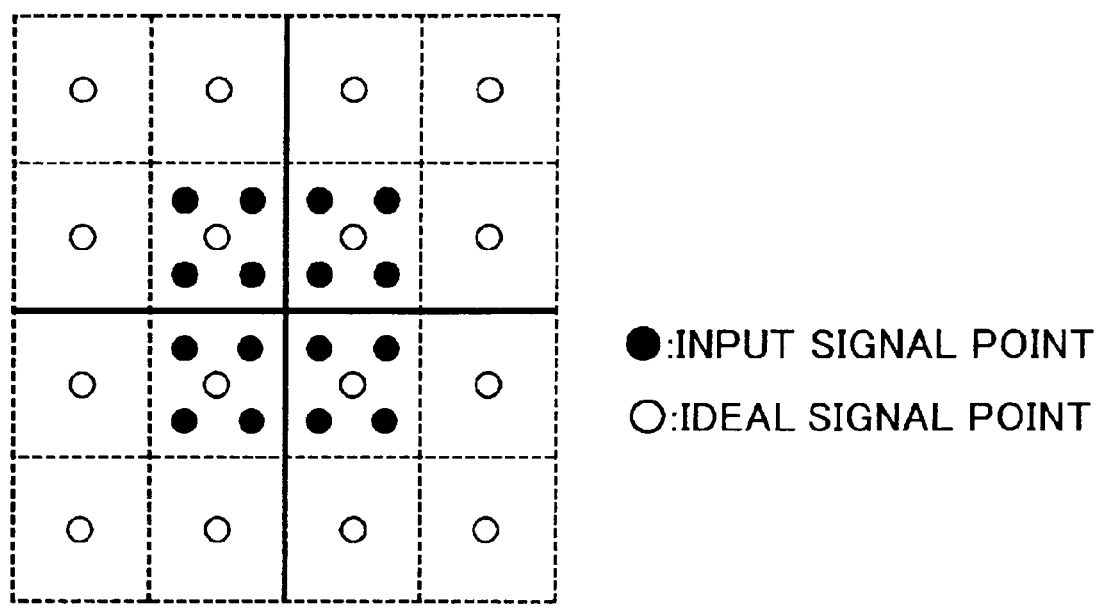
FIG. 9 is a diagram showing the eye pattern that caused the dummy lead.

First of all, a received signal through the communication lines 30 enters a line equalizer (LEQ) 12, and is equalized. The equalized signal then enters a demodulation module (DEM) 14, and the demodulation module 14 demodulates the signal. The demodulated signal then enters an automatic gain control circuit (AGC) 20 through a roll off filter (ROF) 16 and an equalizer (EQL) 19. The AGC circuit 20 controls a level of the received signal to be stabilized. An output signal of the AGO circuit 20 then enters a determination module (DET) 22. Determination module 22 determines in which area of a detection surface, such as shown in FIG. 7, does an input signal corresponds to, and outputs data corresponds to the determined area. Determined data is then output to a data terminal 32 as received data RD.

On the other hand, send data (SD), received from the data terminal 32, enters a signal point generation module (SIG) 24. The signal point generating module 24 generates a signal point information corresponds to the send data. A signal from the signal point generation module is then sent to a modulation module (MOD) 28, through a roll off filter (ROF) 26. The modulation module 28 modulates input signal, and outputs modulated signal onto the communication lines 30 as send signal.

Figure 2:
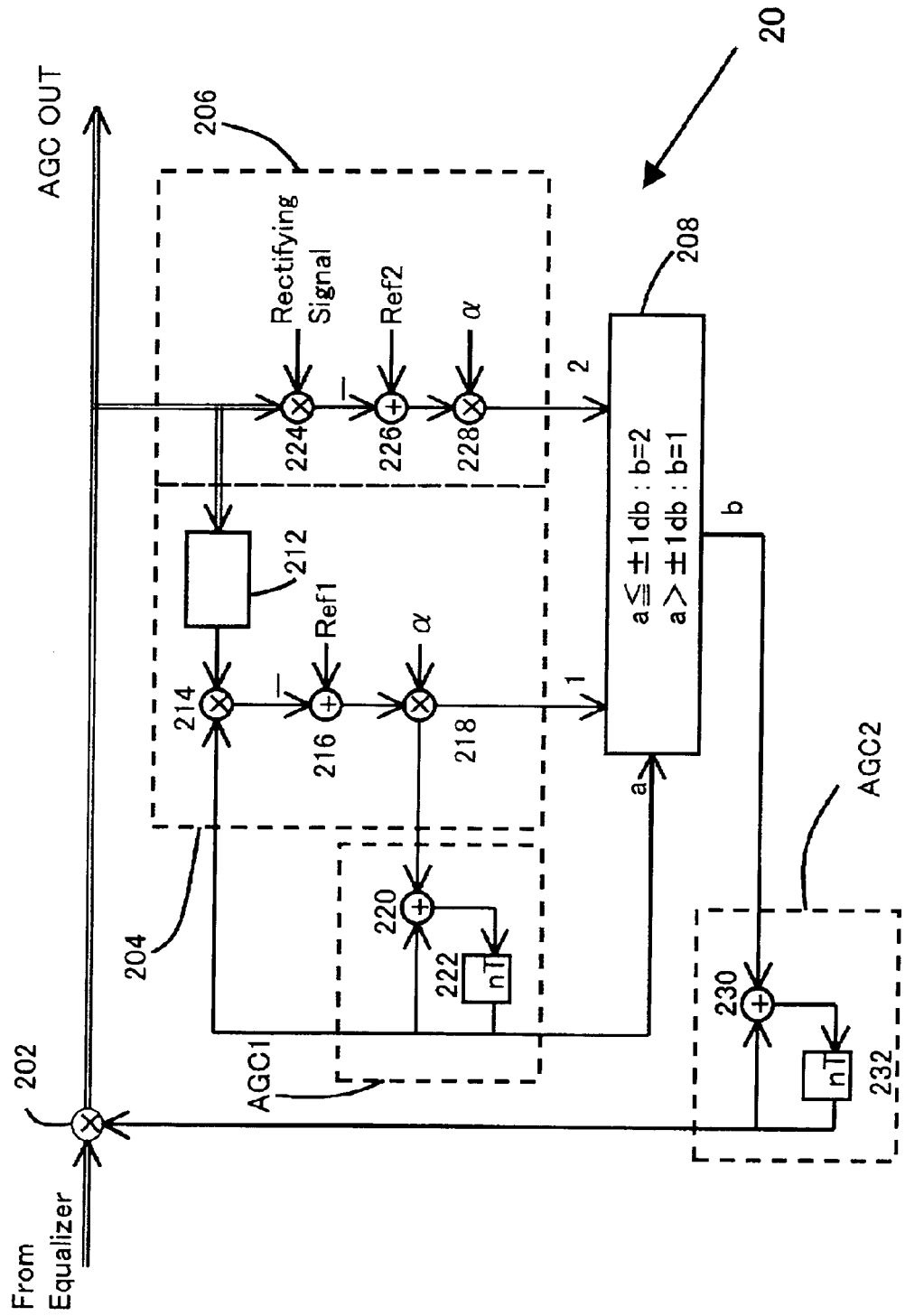
FIG. 2 is a diagram showing an AGC circuit equalizer of the embodiment of the present invention.

FIG. 2 is a diagram showing a configuration of an AGC circuit 20, which corresponds to the AGC circuit 20 shown in FIG. 1, of the present embodiment. The AGC circuit 20 controls a level of an input signal to stabilize a power of a signal. In FIG. 2, a double line indicates a path for a vector signal, and a single line indicates a path for a scalar signal, respectively, as similar to FIGS. 5 and 6.

The AGC circuit 20 of the present embodiment comprises two portions. The first portion has a squaring circuit 212, and is called squaring portion 204 hereafter. The second portion has a multiplier 224, and is called rectifying portion 206 hereafter.

Figure 5:
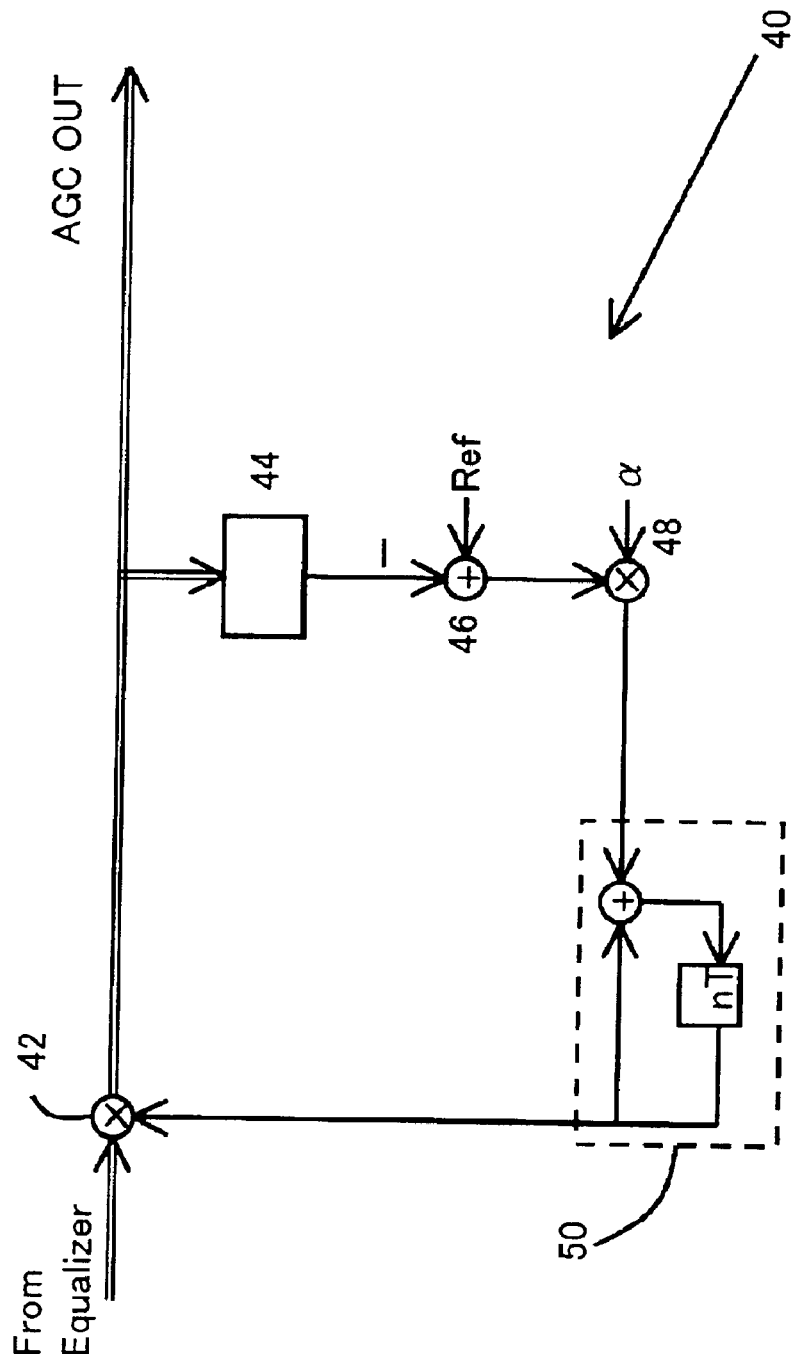
FIG. 5 is a diagram showing an example of a conventional AGC circuits.

The squaring portion 204 has a similar construction as an AGC circuit 40 shown in FIG. 5. The squaring portion 204 controls level of an input signal based on a power of the input signal calculated by the squaring circuit 212.

A vector signal from an equalizer 18 is split into two portions, and one of these enters the squaring portion 204. The squaring circuit 212 calculates a power of the input signal by squaring the input signal. The output signal of the squaring circuit 212, which is a scalar signal, is then sent to a first multiplier 214 and is multiplied by an output signal of a first integrator, which will be called AGC1 hereafter.

An output of the first multiplier 214 enters a subtracting circuit 216. The subtracting circuit 216 calculates a subtraction value between a reference signal (Ref1) and the output of the first multiplier 214. As similar to the AGC circuit 40 as shown in FIG. 5, the reference signal Ref1 has a value equals to an average power of an eye pattern. Therefore, a calculated subtracting value shows a difference between a power of the input signal and an average power of an eye pattern, and is called an error hereafter.

When a power of an input signal is smaller than the reference signal Ref.1, it means the power of the input signal is smaller than the average power of the eye pattern. Therefore, a level of an input signal has to be increased, and an error having a positive value is output from the subtracting circuit 216. On the other hand, when an input signal is larger than the reference signal Ref.1, it means a level of the input signal is larger than the average power of the eye pattern, and the level of the input signal has to be decreased. Therefore, an error having a negative value is output from the subtracting circuit 216.

The output signal of the subtracting circuit 216 then enters a second multiplier 218, and is multiplied by a coefficient alpha. The coefficient alpha determines a range of automatic gain control, which is an integration time of AGC1. If the coefficient alpha is relatively small, then an integration time of AGC1 increases, and if the coefficient alpha is relatively large, an integration time decreases.

Then, an output signal from the second multiplier 218 enters AGC1. AGC1 comprises an adder 220 and a delaying circuit 222, which outputs stored data after a time period of "nT" has passed ("T" is typically one clock cycle). Then AGC1 integrates an output of the second multiplier 218, which is substantially an error amount output from the subtracting circuit 216.

An output of the second multiplier 218 is output from the squaring portion 204 as signal "1". Further, an integrated signal is output from AGC1 as signal "a". Signal "a" indicates how large the difference between an average power of an eye pattern and a power of an input signal is. Both signals enter a determination module 208.

Figure 6:
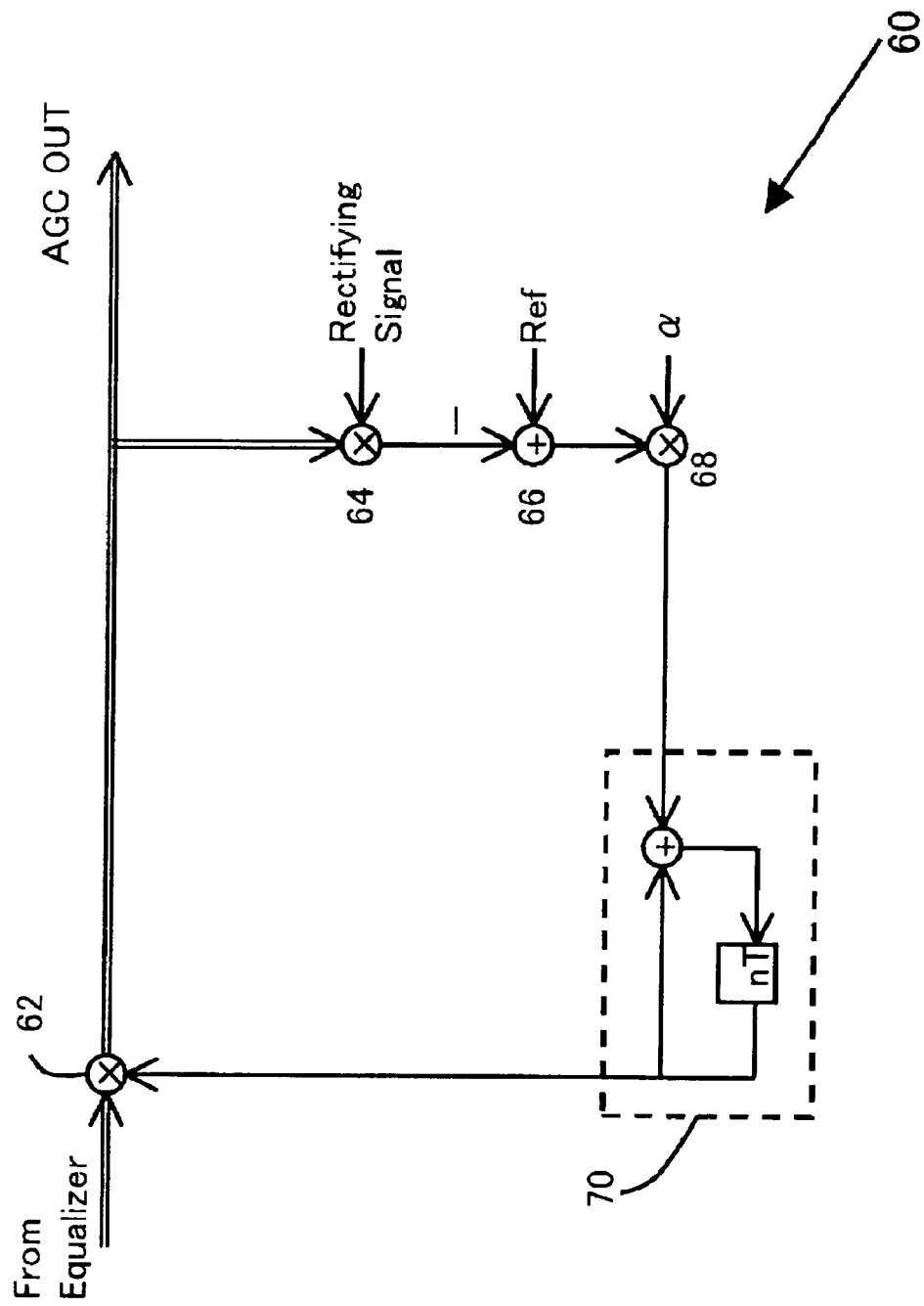
FIG. 6 is a diagram showing another example of a conventional AGC circuits.

On the other hand, the rectifying portion 206 has a similar construction as the AGC circuit 60 shown in FIG. 6. The second portion of the split signal enters a first multiplier 224 of the rectifying portion 206, and is multiplied by a rectifying signal. The value of a rectifying signal is selected as a product of an ideal determination point and the rectifying signal becomes constant as shown in FIG. 8. In this embodiment, it will be [2.0, 0.0].

A real part of the multiplied signal is output from the first multiplier 224, and then sent to a subtracting circuit 226. The subtracting circuit 226 subtracts a signal from the first multiplier 224 from a second reference signal (Ref2). The subtracting circuit 226 calculates a difference (an error hereafter) between the reference signal Ref2, which is a product of the rectifying signal and an ideal determination point, and a product of the rectifying signal and an actual value of an input signal.

When an output of the first multiplier 224 is less than the reference signal, it means that an input signal is closer to the origin of a determination surface (such as shown in FIG. 7) than a determination point. This time, a level of an input signal has to be increased, and an error having a positive value is output from the subtracting circuit 226. On the other hand, if an output of the first multiplier 224 is larger that the reference signal, then an error having a negative value is output from the subtracting circuit 226.

A subtracted signal from the subtracting circuit 226 is sent to a second multiplier 228. There, the subtracted signal is multiplied by a coefficient alpha, similar to the squaring portion 204. A multiplied signal is sent from the second multiplier 228 to the determination module 208 as signal "2".

The determination module 208 determines whether an amount of signal "a", which is a different between the reference signal Ref1 and an input signal, is larger than a predetermined value or not, and output signal "b" based on the determination. More specifically, in this embodiment, the determination module determines if the signal "a" is larger than +/− 1 db from an average power of an eye pattern or not (in absolute value), and selects signal "1" or signal "2" as a signal When the signal "a" is larger than +/−1 db, it means an error is relatively large. For this case, it is suitable to use a squaring portion 204 for an automatic gain control, and the determination module 208 selects the signal "1", as an output signal "b". On the other hand, is the signal "a" is equal to, or smaller than +/− 1 db, it means that a difference between an average power and an actual level of an input signal is relatively small. For this case, it is suitable to use the rectifying portion 206 for an automatic gain control, and the determination module 208 selects the signal "2" as an output signal "b".

Signal "b" is sent to an integrator, which is shown as "AGC2" in FIG. 2, and is integrated by AGC2. AGC2 comprises an adder 230 and a delaying circuit 232, which output stored data after a time period of "nT" has passed as the delaying circuit 222. An output of AGC2 is sent to a multiplier 202 and is multiplied by an input signal from the equalizer 18. When an output from AGC2 has a negative value, then a level of a signal from the equalizer 18 is reduced relatively by the multiplier 202. On the other hand, when an output from AGC2 has a positive value, then a level of a signal from the equalizer 18 is increased relatively by the multiplier 202. In this manner, a level of a signal from the equalizer 18 is adjusted.

The squaring portion 204 is suitable for controlling amplitude of an input signal roughly. Therefore, it is suitable to select the squaring portion 204 when an error is relatively large. On the other and, the rectifying portion 206 is not suitable when a difference between an input signal and an average power of an eye pattern is too large, but is suitable for controlling amplitude of an input signal more accurately. Therefore, it is better to use the rectifying portion 206 for an automatic gain control after an error becomes relatively smaller.

Figure 3:
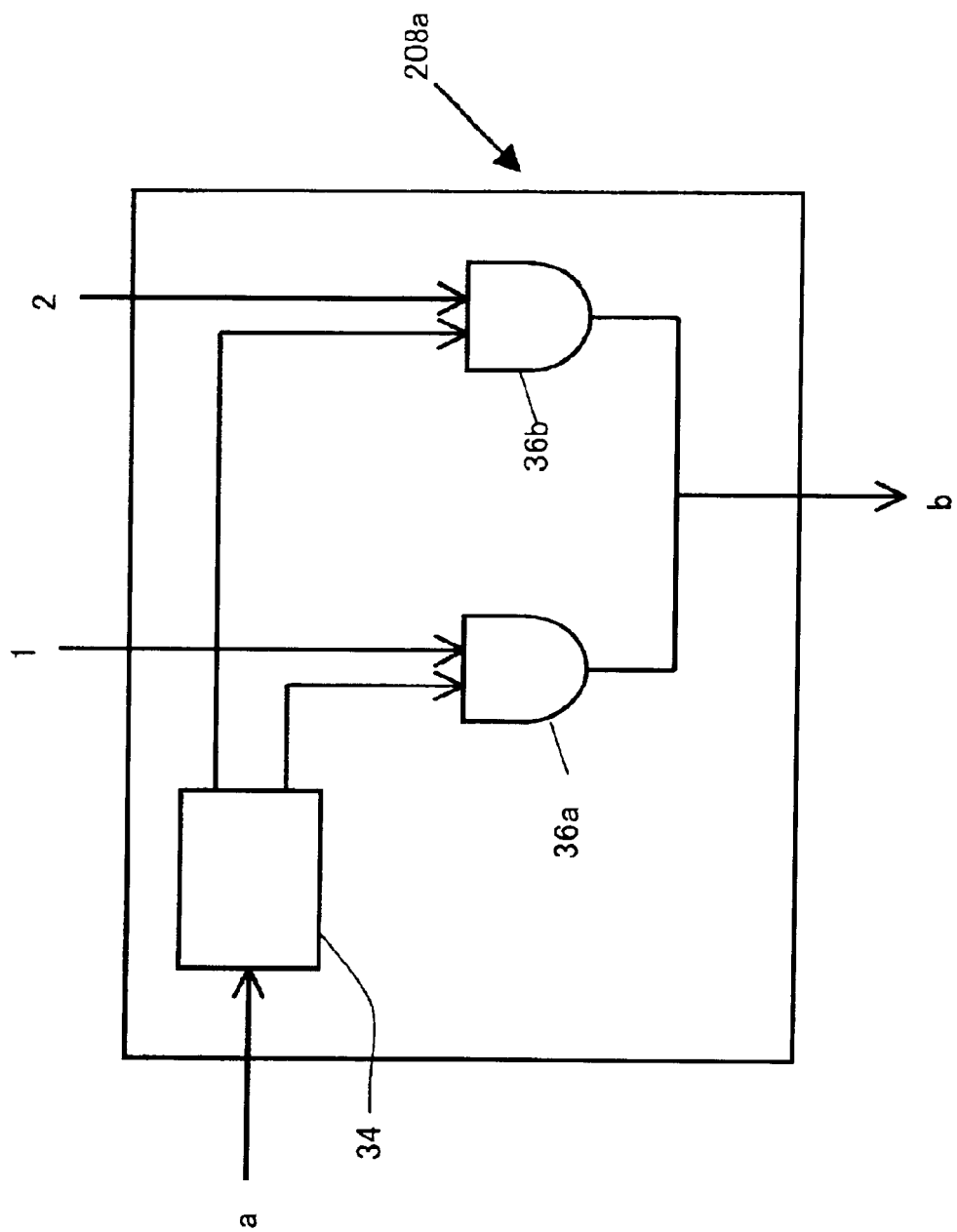
FIG. 3 is a diagram showing a determination module of an embodiment of the present invention.

FIG. 3 shows an example of a determination module 208a. The determination portion 208a comprises a circuit 34 to determine if signal a is larger that +/− 1 db or not. If it is determined that the signal a is larger that +/− 1 db, then the circuit 34 outputs a signal has an amount of "1.0" to a first AND circuit 36a, and a signal has an amount of "0.0" to a second AND circuit 36b. Further, a signal 1 from a squaring portion 204 is input to the first AND circuit, and a signal 2 from a rectifying portion 206 is input to the second AND circuit. Therefore, in this case, the signal 1 is output from the determination module 208a as signal b.

On the other hand, if the signal a is smaller than, or equals to +/− 1 db, then the circuit 34 outputs a signal has an amount of "0.0" to the first AND circuit 36a, and a signal has an amount of "1.0" to the second AND circuit 36b. In this case, a signal 2 is output from the determination portion 208a as a signal b.

Figure 4:
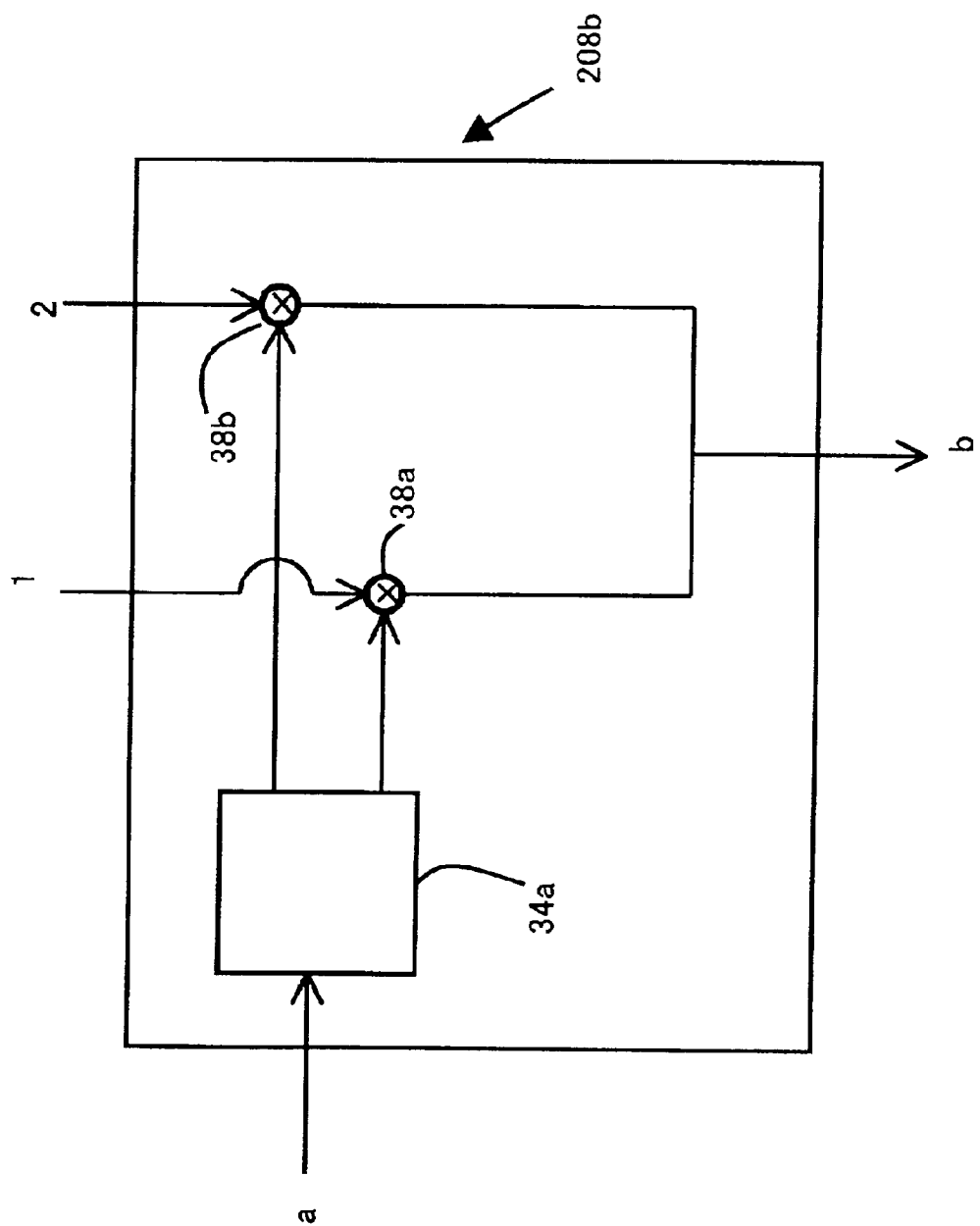
FIG. 4 is another diagram showing a determination module of an embodiment of the present invention.

FIG. 4 shows another example of a determination module 208b. The determination module comprises a circuit 34a, which works as same as the circuit 34 of FIG. 3. The determination module also comprises a first multiplier 38a and a second multiplier 38b. The signal 1 from the squaring portion 204 enters the first multiplier 38a, and the signal 2 from the rectifying portion 206 enters the second multiplier.

If it is determined that the signal a is larger than +/− 1 db, then the circuit 34a outputs a signal has an amount of "1.0" to the first multiplier 38a, and a signal has an amount of "0.0" to the second multiplier 38b. This time, the signal 1 is output from the determination module 28b as the signal b. On the other hand, if the signal is smaller than, or equals to +/− 1 db, then the circuit 34a outputs a signal has an amount of "0.0" to the first multiplier 38a, and a signal has an amount of "1.0" to the second multiplier 38b. In this case, the signal 2 is output from the determination module 208b as the signal b.

Here, during the initial stages of the lead, the AGC circuit 20 carries out a gain control by using the squaring circuit. In this case, the likelihood of a dummy lead is extremely small. If the error of the signal amplitude is led in within a range of +/− 1 dB from the average power of an eye pattern, the AGC circuit 20 carries out the control with the rectifying signal. This reduces the variation corresponding to the input signal and makes more accurate gain control possible.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What we claim is:

1. An automatic gain control circuit comprising:

a first error calculation circuit which calculates an amount of first error between an input signal and a first reference, and outputs a first signal corresponding to said first error;

a second error calculation circuit which calculates an amount of second error between an input signal and a second reference, and outputs a second signal corresponding to said second error;

a determination circuit connected to said first error calculation circuit and said second error calculation circuit, which determines an error amount value of an output first error signal from said first error calculation circuit, and selects as an output signal of said determination circuit one of said first and second signals based on said determination; and an integrator which integrates the output signal from said determination circuit, thereby performing the automatic pain control.

2. An automatic gain control circuit comprising:

a first error calculation circuit which calculates an amount of first error between an input signal and a first reference, and outputs a first signal corresponding to said first error;

a second error calculation circuit which calculates an amount of second error between an input signal and a second reference, and outputs a second signal corresponding to said second error;

a determination circuit connected to said first error calculation circuit and said second error calculation circuit, determines a value of an output signal from said first error calculation circuit, and selects as an output signal of said determination circuit one of said first and second signals based on said determination;

an integrator integrates the output signal from said determination circuit; and a first multiplier and a second multiplier connected to an output port of said first error calculation circuit and said second error calculation circuit respectively;

wherein said determination circuit outputs, based on said determination of said output signal from said first error calculation circuit, a signal of an amount of 1 to one of said first or second multiplier, and a signal of an amount of 0 to said other one of said first or second multiplier.

3. An automatic gain control circuit comprising:

a first error calculation circuit which calculates an amount of first error between an input signal and a first reference, and outputs a first signal corresponding to said first error;

a second error calculation circuit which calculates an amount of second error between an input signal and a second reference, and outputs a second signal corresponding to said second error;

a determination circuit connected to said first error calculation circuit and said second error calculation circuit, determines a value of an output signal from said first error calculation circuit, and selects as an output signal of said determination circuit one of said first and second signals based on said determination;

an integrator integrates the output signal from said determination circuit; and a first AND circuit and a second AND circuit connected to an output port of said first error calculation circuit and said second error calculation circuit respectively;

wherein said determination circuit outputs, based on said determination of said output signal from said first error calculation circuit, a signal of an amount of 1 to one of said first or second AND circuit, and a signal of an amount of 0 to said other one of said first or second AND circuit.

4. A data communications device comprising:

an equalizer for equalizing an input signal from a communication line;

an automatic gain controller, connected to said equalizer, to control a level of an input signal to be stabilized in a constant value;

wherein, said automatic gain controller comprising:

a first error calculation circuit for calculating a first error value between an input signal and a first reference signal;

a second error calculation circuit for calculating a second error value between an input signal and a second reference signal;

an integrating circuit connected to said first or second error calculation circuits, for integrating a difference between a level of an input signal and a predetermined error amount value; and a determination module, connected to said first error calculation circuit, said second error calculation circuit and said integrating circuit, for determining whether an output signal of said integrating circuit is larger than said predetermined error amount value, and selecting one of said first error calculation circuit and said second error calculation circuit for an automatic gain control based on said determination.

5. The data communications device according to claim 4, wherein:

said first error calculation circuit comprising a squaring circuit for squaring an input signal; and a comparator for comparing a difference between said squared signal and a reference signal.

6. The data communications device according to claim 4 or claim 5, wherein:

said second error calculation circuit comprising a rectifying circuit for rectifying an input signal; and a comparator for comparing a difference between said rectified signal and a reference signal.

7. An automatic gain control circuit comprising:

a first error calculation circuit calculating a first error amount between a power of an input signal and an average power of an eye pattern;

a second error calculation circuit calculating a second error amount between a product of an input signal and a rectifying signal and a product of an ideal signal and a rectifying signal;

a first integrator integrating said first error amount;

a determination module connected to said first error calculation circuit, said second calculation circuit and said first integrator, determining whether said integrated error amount exceeds an average power of an eye pattern, and outputting said first error amount when it is determined that said integrated first error amount exceeds said average power of an eye pattern, and outputting said second error amount when it is determined that said integrated error amount does not exceed said average power of an eye pattern; and a second integrator integrating an output signal from said determination module.

8. An automatic gain control method comprising:

calculating a first error between an input signal and a first reference;

calculating a second error between an input signal and a second reference;

determining an error amount value of said first error;

selecting one of said first error and said second error as an output based on said determination; and integrating the selected output, thereby performing the automatic gain control.

9. An automatic gain control method, comprising:

calculating a first error between a power of an input signal and an average power of an eye pattern;

calculating a second error between a product of an input signal and a rectifying signal and a product of an ideal signal and a rectifying signal;

integrating said first error;

determining whether said integrated first error exceeds said average power of an eye pattern;

outputting said first error when said integrated first error exceeds said average power, and outputting said second error when said integrated first error does not exceeds said average power; and integrating said output first or second error.

10. An automatic gain control circuit comprising:

error calculation circuits calculating respective amounts of error between portions of an input signal and corresponding error references, and outputting error signals corresponding to the respective amounts of error; and a determination circuit connected to the error calculation circuits and determining an error amount value of an output error signal from one of the error calculation circuits, and selecting as an output signal from said determination circuit one of the output error signals based on said determination; and an integrator coupled to the determination circuit and integrating the output error signal output from said determination circuit, thereby performing the automatic gain control.

* * * * *

UNITED STATES PATENT AND TRADEMARK OFFICE
CERTIFICATE OF CORRECTION

PATENT NO. : 6,882,684 B2  Page 1 of 1
DATED : April 19, 2005
INVENTOR(S) : Takashi Kaku et al.

It is certified that error appears in the above-identified patent and that said Letters Patent is hereby corrected as shown below:

Column 8,
Line 67, change "pain" to -- gain --.

Column 11,
Line 3, change "exceeds" to -- exceed --.

Signed and Sealed this

Eleventh Day of October, 2005

JON W. DUDAS
*Director of the United States Patent and Trademark Office*